(12) United States Patent
Akizuki et al.

(10) Patent No.: US 7,855,668 B2
(45) Date of Patent: Dec. 21, 2010

(54) DELTA SIGMA A/D MODULATOR

(75) Inventors: Taiji Akizuki, Miyagi (JP); Masahiko Sagisaka, Kyoto (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/550,368

(22) Filed: Aug. 29, 2009

(65) Prior Publication Data

US 2010/0214142 A1 Aug. 26, 2010

(30) Foreign Application Priority Data

Feb. 26, 2009 (JP) .............................. 2009-043696

(51) Int. Cl.
*H03M 3/00* (2006.01)

(52) U.S. Cl. ...................... 341/143; 341/118; 341/120; 341/131; 341/155; 375/316; 375/317; 375/319; 375/345

(58) Field of Classification Search ......... 341/118–121, 341/131, 143, 155; 375/316, 317, 319, 345
See application file for complete search history.

(56) References Cited

U.S. PATENT DOCUMENTS

| | | | |
|---|---|---|---|
| 6,700,514 B2 * | 3/2004 | Soltanian et al. ............ | 341/118 |
| 7,215,266 B2 * | 5/2007 | Li et al. ...................... | 341/118 |
| 7,221,303 B1 | 5/2007 | Melanson | |
| 7,298,305 B2 * | 11/2007 | Melanson .................... | 341/143 |
| 7,298,306 B2 * | 11/2007 | Melanson .................... | 341/143 |
| 7,391,452 B2 * | 6/2008 | Itani ........................... | 348/255 |
| 7,439,890 B2 * | 10/2008 | Schreier et al. ............. | 341/143 |
| 7,474,247 B1 * | 1/2009 | Heinks et al. ............... | 341/155 |
| 7,528,752 B1 * | 5/2009 | Chern ......................... | 341/118 |
| 7,551,108 B1 * | 6/2009 | Lee ............................. | 341/118 |
| 7,649,480 B2 * | 1/2010 | Boomer et al. ............. | 341/120 |
| 7,714,757 B2 * | 5/2010 | Denison et al. ............. | 341/143 |
| 7,769,116 B2 * | 8/2010 | Lebron et al. ............... | 375/345 |
| 2006/0077090 A1 * | 4/2006 | Schimper .................... | 341/155 |
| 2007/0035430 A1 | 2/2007 | Schreier | |
| 2007/0222656 A1 | 9/2007 | Melanson | |

* cited by examiner

*Primary Examiner*—Linh V Nguyen
(74) *Attorney, Agent, or Firm*—Dickinson Wright PLLC

(57) ABSTRACT

A multibit quantizer is provided, at its input terminals, with a variable gain circuit and an offset addition circuit to perform tracking control in which for each sampling time, the level of an offset signal of the offset addition circuit is adjusted based on output digital data of an output processing circuit and the preceding control signal of an offset control circuit so that the quantizer operates without causing a saturation operation. As a result, the output digital data, in which the number of bits is greater than the number of bits of the quantizer by the offset value controlled by the offset addition circuit, is outputted from the output processing circuit for each sampling time.

12 Claims, 10 Drawing Sheets

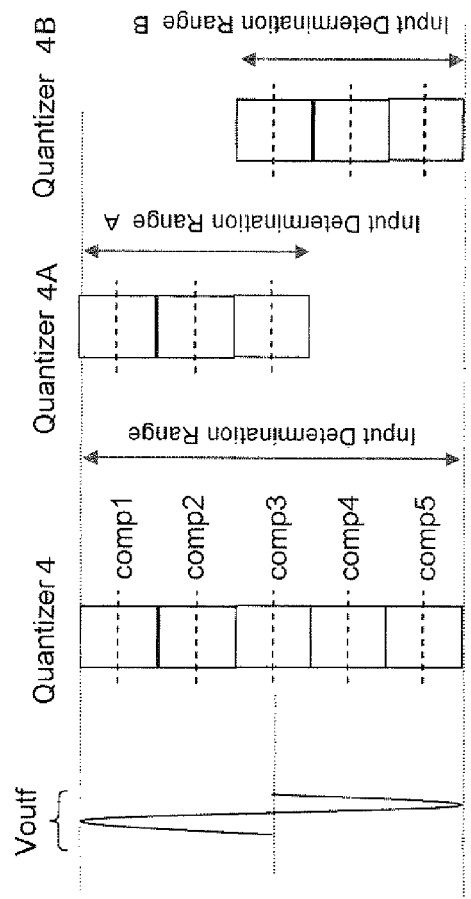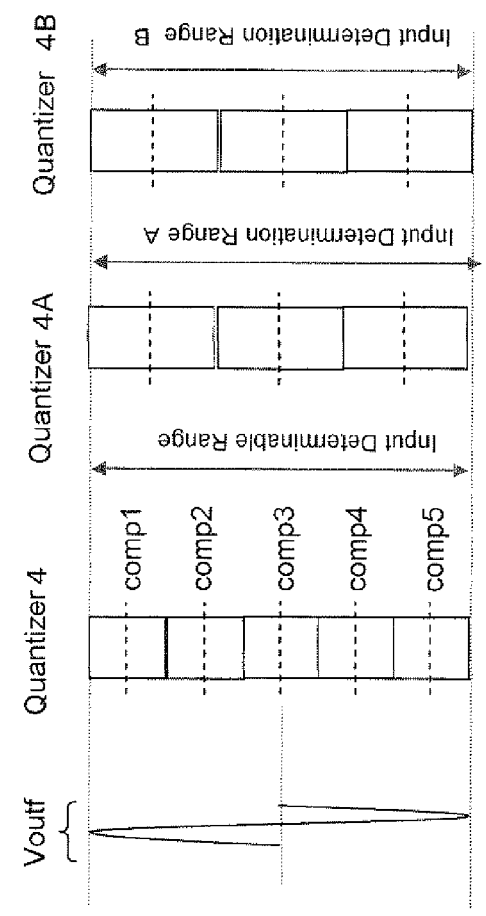
Fig. 7A
Fig. 7B

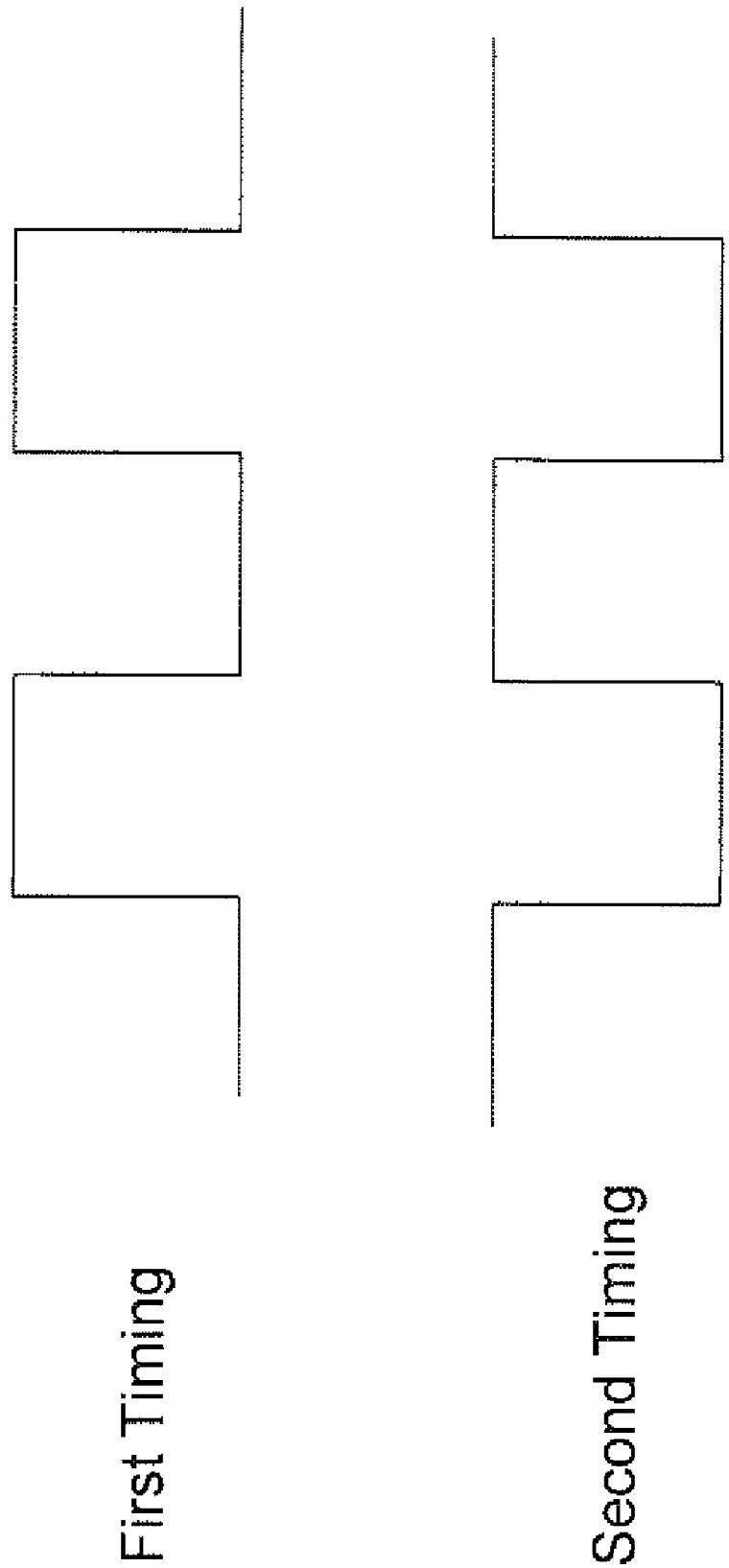

DELTA SIGMA A/D MODULATOR

TECHNICAL FIELD

The present invention relates to a delta sigma A/D modulator having a multibit quantizer used in a discrete-time circuit or the like operated at high speed.

BACKGROUND ART

In recent years, with increase in data rate due to migration of communication systems to broadband, discrete-time circuit realization, which converts an analog circuit to a digital circuit to facilitate circuit design, has been advancing. Furthermore, concurrently with this, reduction in operating voltage has been expedited associated with miniaturization of a process to be used.

Therefore, for an A/D (analog-digital) converter, there has been the necessity to improve an SNR (Signal to Noise Ratio) characteristic and to realize lower voltage in a circuit. Also for a quantizer included in an A/D converter, there has been the necessity to realize a multibit configuration at the time of a low voltage operation.

FIG. 8 is a circuit diagram illustrating an example of a conventional delta sigma A/D (analog-digital) modulator described in Patent Literature 1, which is capable of realizing lower voltage in a multibit quantizer.

The delta sigma A/D modulator illustrated in FIG. 8 is a tracking mode delta sigma A/D modulator, and includes: a DAC circuit (digital-analog conversion circuit) 101; an integration circuit 102 for integrating a value obtained by adding (subtracting) an output signal of the DAC circuit 101 to (from) an input analog signal; a multibit quantizer 103 that has n (n is an integer of 2 or more) comparators 107-1 to 107-n, and that quantizes an output signal of the integration circuit 102, thereby outputting a digital signal; a logic processing circuit 104 for processing the digital signal outputted from the quantizer 103, thereby generating output digital data; a reference voltage generation circuit 105 for generating m (m is an integer greater than n) reference voltages VR-1 to VR-m for quantization, which are outputted to the quantizer 103; and a DAC control circuit 106 for receiving, as an input, the output digital data generated by the logic processing circuit 104, and for controlling the level of the output signal of the DAC circuit 101.

The n comparators 107-1 to 107-n, constituting the quantizer 103, each have one input terminal to which the output signal of the integration circuit 102 is inputted, and the other input terminal to which a different one of reference voltages VR1 to VRn is inputted. Output signals of the comparators 107-1 to 107-n are each inputted to the logic processing circuit 104.

The logic processing circuit 104 controls, based on the digital signal outputted from the quantizer 103, a reference signal (voltage) outputted from the reference voltage generation circuit 105, and synthesizes and outputs the output digital data as an output signal of the delta sigma A/D modulator as described above.

In the configuration of FIG. 8 in particular, based on the digital signals outputted from the n comparators 107-1 to 107-n for each sampling time, and a control signal value outputted to the reference voltage generation circuit 105 at the preceding sampling time, the logic processing circuit 104 outputs, at the next sampling time, a control signal to the reference voltage generation circuit 105 that outputs reference voltages in a switchable manner, and calculates and outputs digital data that should be outputted from the delta sigma A/D modulator.

In this case, from among the m reference voltages VR-1 to VR-m outputted from the reference voltage generation circuit 105, the n reference voltages are selected in advance as the reference voltages VR1 to VRn at the preceding sampling time, and supplied to the quantizer 103 including the n comparators 107-1 to 107-n, so that the output signal of the integration circuit 102 can be always determined within a determinable range in which the signal level thereof can be determined without saturation. The logic processing circuit 104 performs this selection by a control method set in advance.

Eventually, the tracking mode delta sigma A/D modulator configured as illustrated in FIG. 8 has a comparator configuration including the n comparators; whereas, as the reference voltages VR1 to VRn for comparison supplied to the n comparators 107-1 to 107-n, the n reference voltages are selected from the m (n<m) reference voltages VR-1 to VR-m, the number of which is larger than that of the comparators, and are supplied to the quantizer 103, thereby enabling comparative determination and digital output of the signal inputted from the integration circuit 102. Therefore, the digital output data for the number of steps m ($\log_2$ (m+1) bits) equal to the number of the actually switched reference voltages can be outputted from the logic processing circuit 104.

Thus, when a delta sigma A/D modulator for the number of steps m is implemented, m comparators are required in a configuration using no tracking mode; whereas, in the configuration of FIG. 8, the delta sigma A/D modulator for the number of steps m can be implemented with the n comparators. In other words, the number of comparators can be reduced by the number (m-n), thereby providing effective means for reducing circuit area and current consumption.

SUMMARY OF INVENTION

Technical Problem

However, when an operating power supply voltage is reduced in the delta sigma A/D modulator illustrated in FIG. 8, the input determination range of the quantizer including a plurality of comparators is narrowed. Hence, in order to properly operate the n-bit quantizer, there arises the necessity to narrow a determination range, serving as a step width of each comparator, so as to improve accuracy, resulting in increases in circuit area and current consumption of the comparator circuit.

Hereinafter, with reference to FIGS. 9A and 9B, changes in the input determination range of a quantizer when a circuit power supply voltage is reduced by one-half will be further described.

FIG. 9A Illustrates a case where the power supply voltage is normal (VDD), e.g., a case where a normal operation is performed during which the quantizer performs no tracking operation. In this case, in order for the quantizer to perform determination for m steps, an input maximum amplitude range for the quantizer is defined as VFS_a, and the step width serving as the determination range of each of comparators Comp1 to Compm will be a voltage width of VFS_a/m equal to a voltage difference between the two adjacent ones (e.g., Vref1-Vref2) of reference voltages Vref1 to Vrefm supplied to the respective comparators Comp1 to Compm.

Further, when a tracking operation is performed, the determination range of the quantizer for the next sampling time (T(n)) is predicted from the output digital data provided from the logic processing circuit at the preceding sampling time (T(n−1)), and the reference voltages are switched. Hence, the quantizer needs a determinable range in which input signal changes for at least two sampling times (T(n−1) and T(n)) can be determined, and the number of comparators to be used will be n (n<m), for example, which is smaller than that when no tracking operation is performed.

It is to be noted that even in the case of a tracking mode, the determination range of each comparator is a voltage width of VFS_a/m, which is similar to that when no tracking operation is performed.

On the other hand, as illustrated in FIG. 9B, when the power supply voltage is reduced to half of the normal power supply voltage (VDD/2), the determinable range of the quantizer is proportional to the power supply voltage if the respective comparators are formed by MOS transistors and the respective transistors have the same operating conditions and characteristics, for example. In other words, when the power supply voltage is reduced by one-half, the determinable range of the quantizer is also similarly reduced by one-half.

Therefore, the determination range of each of the m comparators, constituting the quantizer, also becomes VFS_b/m, which is half of the VFS_a/m when the power supply voltage is the normal power supply voltage VDD.

On the other hand, if the respective MOS transistors constituting the respective comparators have the same operating conditions and characteristics, there occur the same characteristic variations due to drain-to-source voltage changes; therefore, also when the power supply voltage is reduced to half of the normal power supply voltage, the respective comparators have determination variation ranges same as that when the power supply voltage is the normal power supply voltage VDD.

That is to say, if the power supply voltage is reduced by one-half, the determination accuracy represented by the determination variation range with respect to the determinable range of each comparator is similarly reduced by one-half, and determination errors are increased, thereby causing degradation in the SNR characteristic of the delta sigma A/D modulator.

Hence, when the delta sigma modulator is operated at half of the normal power supply voltage without degradation in the SNR characteristic thereof, it is also necessary to reduce the determination variation range of each comparator by one-half. Normally, the areas of the MOS transistors are inversely proportional to characteristic variations, and therefore, the areas of the MOS transistors will be increased to the extent that the characteristic variations are allowable. In this case, if the MOS transistors have the same operating conditions, current consumption is proportional to the areas thereof in general; as a result, in order to maintain the quantizer with the same characteristics and accuracy when the voltage is low, the circuit area and current consumption are consequently increased.

Therefore, in the delta sigma A/D modulator that uses the tracking mode quantizer according to the conventional example, when an operation is performed at a reduced power supply voltage, reductions in circuit area and current consumption disadvantageously cannot be expected even if the number of comparators is decreased.

Furthermore, when the power supply voltage is reduced to half of the normal power supply voltage (VDD/2) as illustrated in FIG. 9B, the determinable range of the quantizer can be maintained at the same level as that when the power supply voltage is normal if a circuit having a correction gain, which is the reciprocal (VFS_a/VFS_b) of a gain equivalent to a change in the determinable range of the quantizer, is added at the input of the quantizer. It is to be noted that since the determinable range is multiplied by the correction gain, a plurality of the reference voltages (Vref1b to Vrefmb) also have to be multiplied by the correction gain accordingly (Vref1 to Vrefm).

Hence, even if the correction gain circuit is added to the quantizer operated in the modes of FIGS. 9A and 9B and the tracking mode is used, it is necessary to perform determination on all the reference voltages (Vref1 to Vrefm) multiplied by the correction gain, thus causing a problem that a reduction in the voltage of the quantizer cannot be realized even if a reduction in the voltage of the integration circuit can be realized.

Hereinafter, the above-mentioned problem will be described in more detail.

In a system in which the tracking mode quantizer according to the conventional example is used and the reference voltages are switched, the determinable range of the quantizer and the determination range of each comparator are decided in proportion to respective reference voltage widths of the reference voltage generation circuit inputted to the quantizer, and the voltage range (i.e., the range of Vref1 to Vrefm) which is the total of the reference voltage widths.

In other words, if the respective reference voltage widths cannot be modified by changing comparator accuracy, the determinable range of a signal inputted to the quantizer cannot be changed, and the maximum input range of an output of the integration circuit (if there is a variable gain circuit, an output thereof) is decided within this limitation.

Further, the conventional tracking mode quantizer is operated in the same manner as in the case where an unused comparator is turned OFF from a normal mode, and has a mode of adding the value of the comparator turned OFF by a digital value to output digital data. Therefore, regardless of the presence or absence of tracking, the maximum input range from the integration circuit to the quantizer is not changed, and is decided by the voltage range of the reference voltages. Furthermore, the maximum input range from the output of the integration circuit (if a variable gain circuit is added, the output thereof) will be the same range as the determinable range of the quantizer.

In other words, if the quantizer accuracy is kept as it is, the respective reference voltage widths of the reference voltages do not change, and the determinable range of the quantizer does not change. As a result, the maximum input range of the output of the integration circuit (if there is a variable gain circuit, the output thereof) also cannot be changed. The maximum input range is represented by the following relational expression:

Maximum Input Range=Determinable Range∝Each Reference Voltage Width of Comparator∝Comparator Accuracy Thus, even if the output of the integration circuit is reduced by reducing the power supply voltage, the maximum input range inputted to the quantizer is kept unchanged by performing gain multiplication. However, when the determinable range is equal to the maximum input range and cannot be reduced in the conventional system, the determinable range is reduced by reducing the power supply voltage, resulting in the necessity to increase the comparator accuracy.

Accordingly, an object of the present invention is to provide, when an operation is performed at a reduced power supply voltage in a multibit delta sigma A/D modulator, the delta sigma A/D modulator in which while a quantizer is formed by a plurality of comparators, the number of which is smaller than the number of bits outputted from the delta sigma A/D modulator in a tracking mode, the determination variation range of the comparators is maintained, thereby enabling a reduction in the number of bits of output of the quantizer and a voltage reduction in a circuit without an increase in accuracy, and maintaining an SNR characteristic while reducing circuit area and current consumption.

Another object of the present invention is to provide a delta sigma A/D modulator capable of allowing the determinable range of a quantizer to be narrower than the maximum input range from a variable gain circuit.

Solution to Problem

To solve the above-described problems, a first aspect according to the present invention provides a delta sigma A/D modulator including:

a DAC circuit;

an integration circuit for adding and integrating an input analog signal and an output signal of the DAC circuit;

a variable gain circuit for changing a gain of an output signal of the integration circuit to provide an output signal;

a quantizer for quantizing the output signal of the variable gain circuit;

an offset addition circuit for generating an offset signal, and for adding the offset signal to the output signal of the variable gain circuit to input the resultant signal to the quantizer, thereby causing the quantizer to output a digital signal equivalent to a level of a total of the output signal of the variable gain circuit and the offset signal;

an offset control circuit for outputting a control signal for controlling the offset addition circuit;

an output processing circuit for generating output digital data equivalent to a value obtained by subtracting the offset signal from the output signal of the variable gain circuit based on the digital signal outputted from the quantizer and the control signal outputted from the offset control circuit; and a DAC control circuit for receiving, as an input signal, the output digital data outputted from the output processing circuit, and for controlling a level of the output signal of the DAC circuit, wherein the quantizer includes two or more comparators for making a comparison between a level of the signal obtained by adding the offset signal to the output signal of the variable gain circuit, and each of reference voltages of a reference voltage group, wherein the offset control circuit generates a control signal for the present sampling based on the output digital data of the output processing circuit and the control signal for the preceding sampling time, which has been outputted to the offset addition circuit, wherein the offset addition circuit outputs the offset signal having a voltage responsive to the control signal outputted from the offset control circuit, and wherein the offset signal of the offset addition circuit is controlled by the offset control circuit for each sampling time so that the quantizer operates without causing a saturation operation with the output signal of the integration circuit falling within a determinable input range of the quantizer, and as a result, the output digital data, in which the number of bits is greater than the number of bits of the quantizer by the offset value controlled by the offset addition circuit, is outputted from the output processing circuit for each sampling time.

The delta sigma A/D modulator formed as described above is provided with the variable gain circuit for changing the gain of the output signal of the integration circuit to supply the resultant signal to the quantizer. Thus, when a power supply voltage is set at a low level, the input determination range of each comparator can be freely set.

Further, the offset addition circuit is provided at the input of the quantizer so as to control the quantizer in a tracking mode. Thus, the quantizer can be formed by the comparators, the number of which is equal to or less than the number of output bits of the delta sigma A/D modulator, and the determinable range of the quantizer can be set as a determinable range that is narrower, by an offset amount added by the offset addition circuit, than the maximum input range obtained by multiplying the maximum input range from the integration circuit by a gain in the variable gain circuit.

Hence, it is possible to provide characteristics and accuracy similar to those of a multibit quantizer operated at a normal power supply voltage without increasing circuit area and current consumption of the multibit quantizer.

A second aspect according to the present invention provides a delta sigma A/D modulator, wherein the quantizer according to the first aspect includes: a first quantizer including two or more first comparators having a determinable input range in a direction in which an input signal after one sampling time is increased; and a second quantizer including two or more second comparators having a determinable input range in a direction in which an input signal after one sampling time is decreased, wherein the offset addition circuit includes a first offset addition circuit and a second offset addition circuit so that different offset signals can be added to the first quantizer and the second quantizer, wherein the offset control circuit outputs first and second control signals for controlling the first offset addition circuit and the second offset addition circuit, and wherein the output processing circuit generates output digital data based on: digital signals outputted from the first quantizer and the second quantizer; and the first and second control signals outputted from the offset control circuit.

A third aspect according to the present invention provides a delta sigma A/D modulator, wherein the offset addition circuit according to the first aspect includes a plurality of switched capacitor circuits, including: a first switch group for applying, at a first timing, an offset reference voltage to a capacitor to charge the capacitor with an electric charge; and a second switch group for discharging the electric charge of the capacitor at a second timing, and wherein in order to prevent the same switched capacitor circuit from being always selected to output an output signal in response to the signal outputted from the offset control circuit, there is provided a random control circuit for randomly switching, at the second timing, an output control destination of the offset control circuit for the plurality of switched capacitor circuits so that switching control of an output control signal for controlling the offset addition circuit is carried out.

A fourth aspect according to the present invention provides a delta sigma A/D modulator, wherein the offset addition circuit and the variable gain circuit according to the first aspect are each formed by a plurality of switched capacitor circuits, and a gain of the variable gain circuit is adjusted by a ratio between electric charge amounts outputted to the quantizer and discharged in response to the respective switched capacitor circuits.

A fifth aspect according to the present invention provides a delta sigma A/D modulator, wherein the offset addition circuit according to the first aspect includes: an offset voltage generation circuit for generating and outputting a plurality of offset voltages; a selector switch for selectively outputting one of the offset voltages outputted from the offset voltage generation circuit; and a switched capacitor circuit for charging/discharging an electric charge equivalent to the offset voltage outputted from the selector switch, and the selector switch is controlled by the offset control circuit, thereby controlling the voltage of the offset signal outputted from the offset addition circuit.

A sixth aspect according to the present invention provides a delta sigma A/D modulator, wherein in the first aspect, a filtering characteristic provided by the integration circuit is changed by a mode selection control signal, and the number of comparators for performing a determination operation is selected from among a plurality of the comparators constituting the quantizer, thereby switching the determinable input range of the quantizer.

A seventh aspect according to the present invention provides a delta sigma A/D modulator, wherein in the first aspect, the variable gain circuit includes a gain switching circuit formed by a plurality of amplifier circuits with different gain settings, and a gain inputted to the quantizer is switched so that the bit accuracy of the quantizer is increased by raising the gain when an amplitude level of an analog signal is low due to a small-signal control signal, and the bit accuracy of the quantizer is reduced by lowering the gain when an amplitude level of an analog signal is high, thereby changing the bit accuracy of the quantizer in accordance with the amplitude level of the input analog signal.

Advantageous Effects of Invention

In the above-described configuration of the present invention, there is provided the variable gain circuit serving as a circuit for adjusting the gain of an input to the quantizer; thus, even if a power supply voltage is reduced and the amplitude level range of an output of the integration circuit is reduced in order to enable a low voltage operation, the maximum amplitude range of an output of the variable gain circuit can be kept constant without narrowing the range.

Moreover, the quantizer is controlled in the tracking mode and operated by the comparators, the number of which is smaller than that of the comparators when no tracking is performed, thereby narrowing the determinable range in which the quantizer can perform determination for each sampling time, and enabling a reduction in the number of the comparators.

In addition, the determinable range necessary for the quantizer can be narrowed from the maximum input range from the variable gain circuit by the offset amount added from the offset addition circuit. Thus, the offset amount added for each sampling time is adjusted, thereby allowing the determinable range necessary for the quantizer for all sampling times to be always controlled so as to be within the minimum range.

Furthermore, the offset signal of the offset addition circuit is controlled by the offset control circuit for each sampling time so that the quantizer operates without causing a saturation state with the output signal of the integration circuit falling within the determinable input range of the quantizer including the two or more comparators. Thus, a digital output signal, in which the number of bits is greater than the number of bits of the quantizer by the offset value controlled by the offset addition circuit, can be outputted for each sampling time.

Specifically, even when the power supply voltage is changed to a low level, it is possible to carry out control so as not to change the input determination range of the quantizer and the determination range between the respective comparators, thus enabling an operation of the tracking mode delta sigma A/D modulator for providing a digital output, in which the number of bits is greater than the number of comparators, without increasing the circuit area and current consumption of the multibit quantizer during a low voltage operation.

BRIEF DESCRIPTION OF DRAWINGS

FIGS. 7A and 7B are schematic diagrams each illustrating the determination range of a quantizer in the delta sigma A/D modulator according to Embodiment 2 of the present invention.

FIG. 10 is a timing chart illustrating ON/OFF timing of a switch of a switched capacitor.

DESCRIPTION OF EMBODIMENTS

Hereinafter, preferred embodiments of a delta sigma A/D modulator according to the present invention will be described with reference to the appended drawings.

Embodiment 1

In the present invention, a variable gain circuit and an offset addition circuit are provided at inputs of a quantizer as will be described in detail below, and therefore, the present invention has the following features.

In a tracking mode of the present invention, an operation is similar to that performed in a case where an unused comparator is turned OFF from a normal mode, but a reference voltage width equal to the value of the comparator that is turned OFF is added, as an offset value, also to an analog value, i.e., an input to the quantizer.

In other words, the maximum input range from the variable gain circuit is a range to which the offset value and the determinable range of the quantizer are added. Therefore, irrespective of the maximum input range from the variable gain circuit, the determinable range of the quantizer can be reduced. The maximum input range can be represented by the following relational expression:

Maximum Input Range=Determinable Range+Offset Amount

Accordingly, the determinable range is not proportional to respective reference voltage widths and/or accuracy of comparators, and the determinable range of the quantizer can be narrower than the maximum input range from the variable gain circuit.

In the conventional example, the determinable range is equal to the maximum input range, but if the configuration of the offset addition circuit according to the present invention is provided, the determinable range can be narrower than the maximum input range, thus eliminating the necessity to reduce a power supply voltage for the quantizer, and obviating the necessity to increase comparator accuracy because comparator accuracy is not reduced. Further, even if a circuit for gain multiplication is included in the conventional tracking system, there arises the necessity to increase comparator accuracy when a power supply voltage is reduced. To the contrary, such a necessity is eliminated in the circuit of the present invention in which offset addition is performed at a preceding stage.

Figure 1:
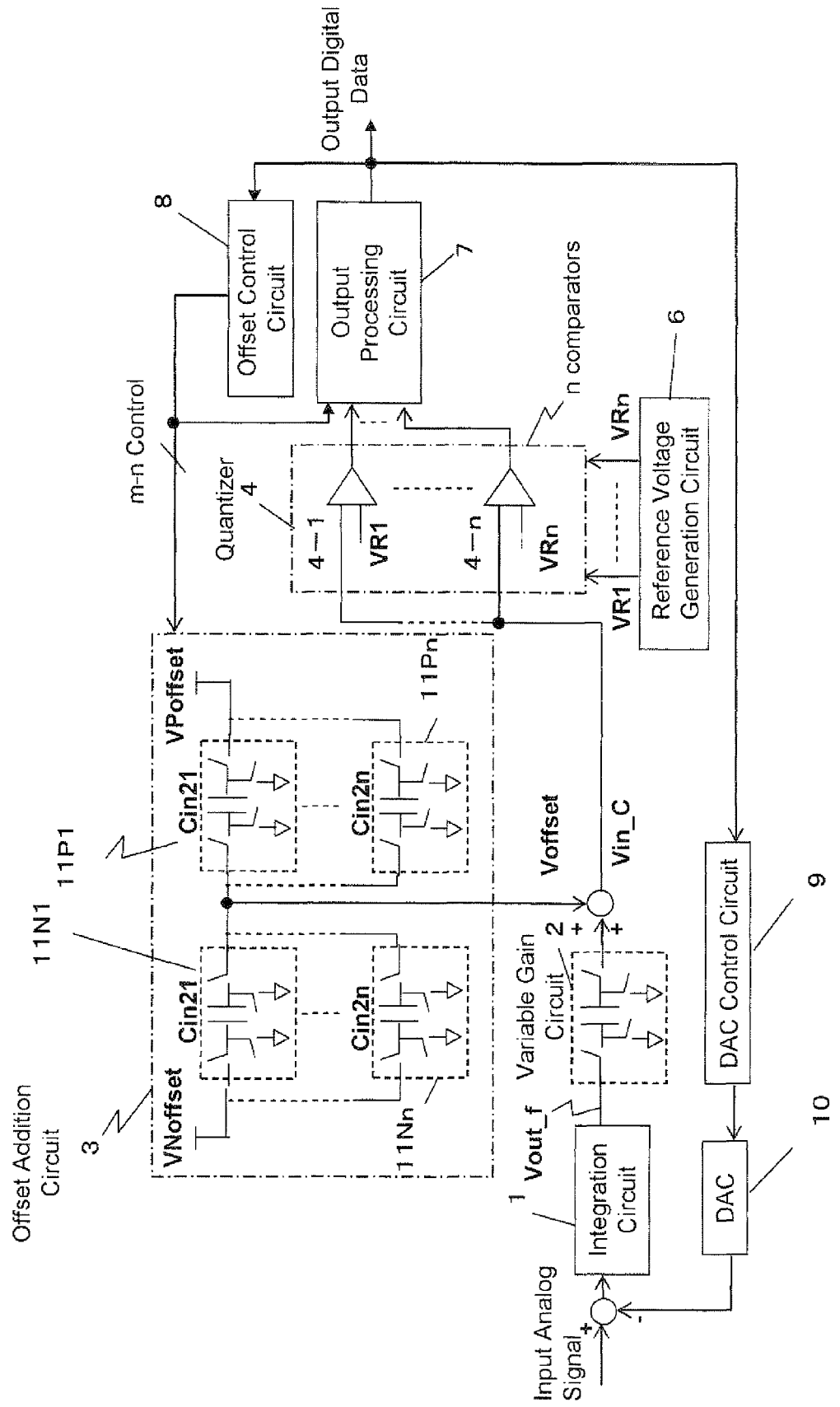
FIG. 1 is a block diagram illustrating a configuration of a delta sigma A/D modulator according to Embodiment 1 of the present invention.

FIG. 1 is a circuit diagram illustrating a tracking mode delta sigma A/D modulator according to Embodiment 1 of the present invention, having a multibit quantizer including a plurality of comparators.

As illustrated in FIG. 1, the delta sigma A/D modulator according to Embodiment 1 is provided with an offset addition circuit 3 and a variable gain circuit 2 at inputs of a multibit quantizer 4.

More specifically, the delta sigma A/D modulator according to Embodiment 1 includes: a DAC circuit (digital-analog conversion circuit) 10; an integration circuit 1 for integrating a value obtained by adding (subtracting) an output signal of the DAC circuit 10 to (from) an input analog signal; the variable gain circuit 2 for changing a gain of an output signal Vout_f of the integration circuit 1 to output the resultant signal; the multibit quantizer 4 that has n (n is an integer of 2 or more) comparators 4-1 to 4-n, and that quantizes the output signal Vout_f of the integration circuit 1, thereby outputting a digital signal; the offset addition circuit 3 for generating an offset signal Voffset and for adding the offset signal Voffset to the output signal of the variable gain circuit 2 to input the resultant signal to the quantizer 4, thereby causing the quantizer 4 to output a digital signal equivalent to the level of a total Vin_C of the output signal of the variable gain circuit 2 and the offset signal Voffset; an offset control circuit 8 for outputting a control signal for controlling the offset addition circuit 3; an output processing circuit 7 for generating output digital data equivalent to a value obtained by subtracting the offset signal Voffset from the output signal of the variable gain circuit 2 based on the digital signal outputted from the quantizer 4 and the control signal outputted from the offset control circuit 8; and a DAC control circuit 9 for receiving, as an input signal, the output digital data outputted from the output processing circuit 7, and for controlling the level of the output signal of the DAC circuit 10.

Further, the quantizer 4 includes the two or more comparators 4-1 to 4-n for making comparisons between the level of the signal Vin_C, obtained by adding the offset signal Voffset of the offset addition circuit 3 to the output signal of the variable gain circuit 2, and reference voltages VR1 to VRn of each reference voltage group outputted from a reference voltage generation circuit 6. In this embodiment, the reference voltages VR1 to VRn outputted from the reference voltage generation circuit 6 are inputted to the n comparators 4-1 to 4-n just as they are.

Furthermore, the offset control circuit 8 generates a control signal for the present sampling based on the output digital data of the output processing circuit 7 and the control signal for the preceding sampling time, which has been outputted to the offset addition circuit 3.

Moreover, the offset addition circuit 3 outputs the offset signal Voffset having a voltage responsive to the control signal outputted from the offset control circuit 8.

Furthermore, the offset signal Voffset of the offset addition circuit 3 is controlled for each sampling time so that the quantizer 4 operates without causing a saturation operation with the output signal of the integration circuit 1 failing within the determinable input range of the quantizer 4. As a result, the output digital data, in which the number of bits is greater than the number of bits of the quantizer 4 by the offset value controlled by the offset addition circuit 3, is outputted from the output processing circuit 7 for each sampling time.

Figure 8:
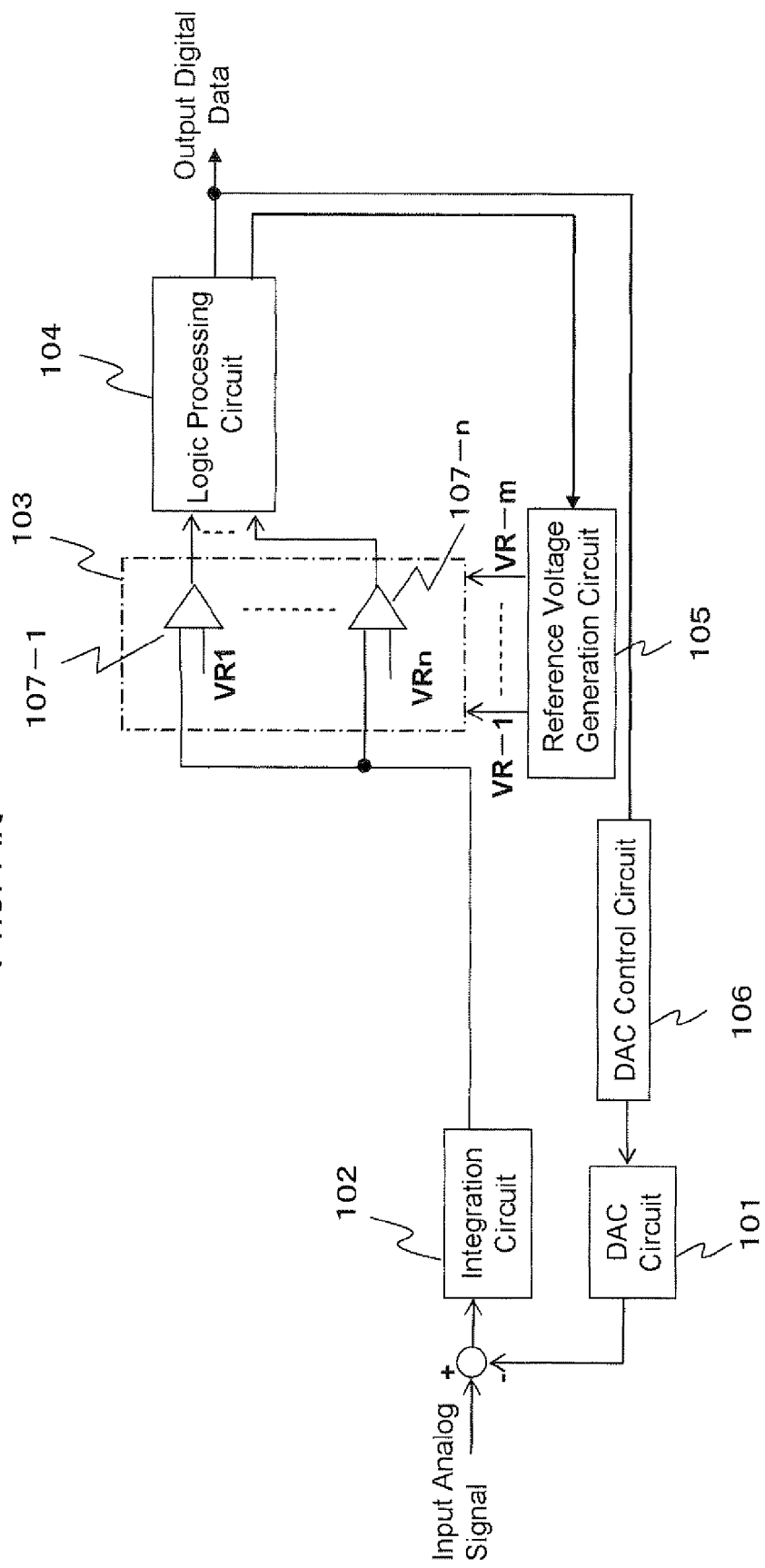
FIG. 8 is a block diagram illustrating a configuration of a delta sigma A/D modulator according to a conventional example.
Figure 9A:
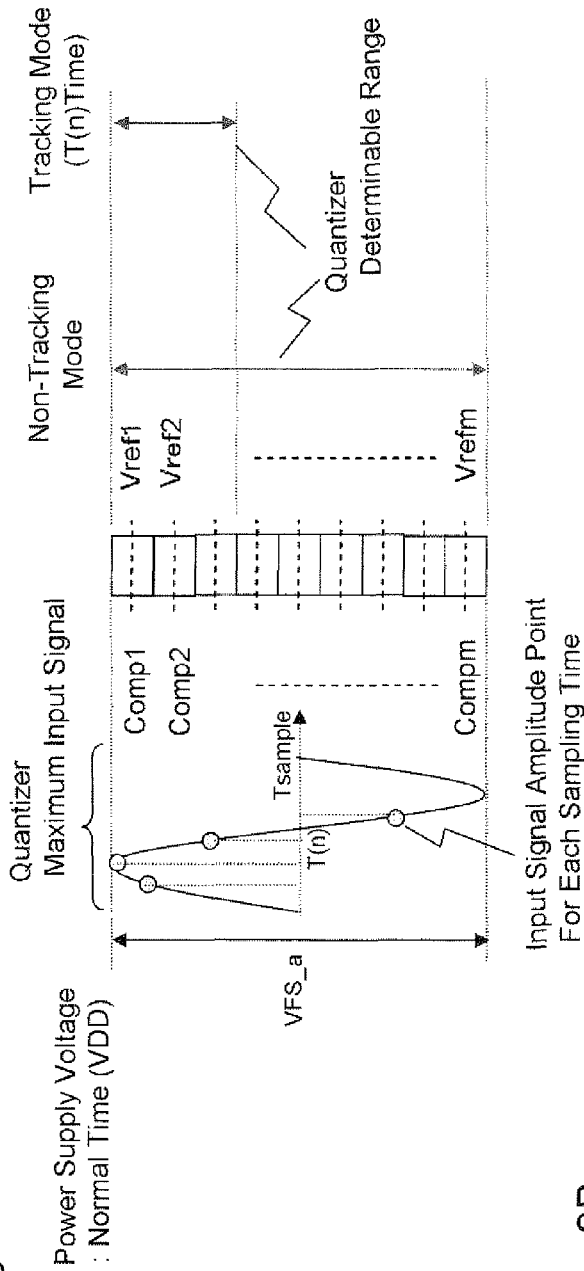
FIGS. 9A and 9B are schematic diagrams each illustrating the determination range of a quantizer according to the conventional example.
Figure 9B:
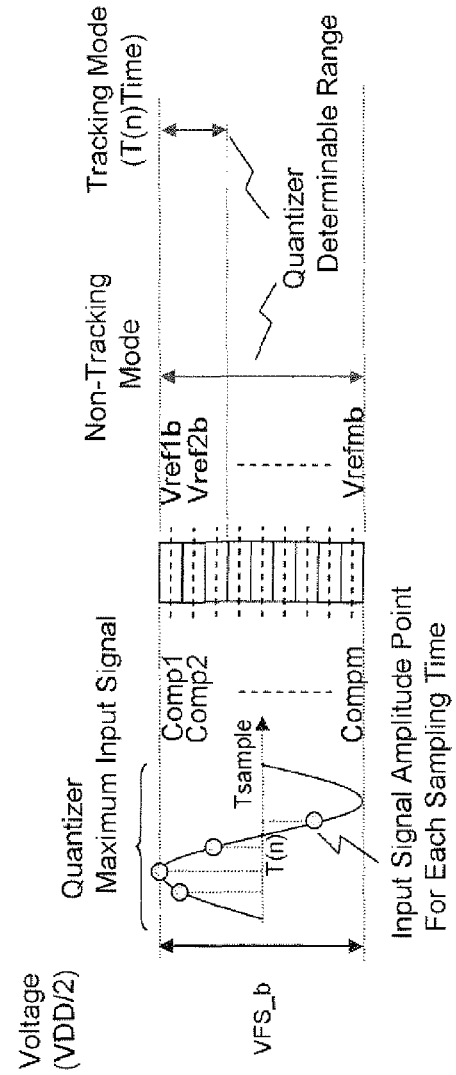

The quantizer 4 in Embodiment 1 includes the two or more comparators, and consideration is given to a case where the quantizer 4 includes the n comparators, for example. The respective determination ranges of the n comparators 4-1 to 4-n are decided by the respective reference voltage differences of the reference voltages VR1 to VRn supplied from the reference voltage generation circuit 6. In FIG. 8, VFS_a/n equal to a voltage difference between respective reference voltages (e.g., Vref1-Vref2) serves as each input step width of the multibit quantizer.

Further, the offset addition circuit 3 for adding the offset signal Voffset at the input of the quantizer 4 adds the voltage of the integral multiple of a voltage equal to each input step width of the quantizer 4, i.e., the offset signal Voffset, to the output signal Vout_f of the variable gain circuit 2, thereby generating the signal Vin_C. The voltage of the offset signal Voffset of the offset addition circuit 3 is controlled by a predetermined control method so that this signal Vin_C will not exceed the determinable range of the quantizer 4 at all times, thereby carrying out tracking control of the multibit quantizer 4.

Hereinafter, an example of the predetermined control method mentioned above will be described. In the control method for the offset addition circuit 3, when consideration is given to a case where the number of steps n of the quantizer 4 including the n comparators 4-1 to 4-n, for example, is an odd integer value, the center comparator is the comparator of (n+1)/2 step, i.e., (n+1)/2-th comparator, and there exist the determinable ranges of the (n−1)/2 step(s) for greater input amplitude and smaller input amplitude.

In this case, the tracking mode control is carried out to control the level of the offset signal Voffset outputted from the offset addition circuit 3, which is added to the output signal Vout_f of the variable gain circuit 2, so that the determination value for the preceding sampling time comes to the center step for the next sampling time.

Hereinafter, the control carried out for each sampling time where n=5 and input step width VFS_a/n=2 will be described by way of example.

Figure 2:
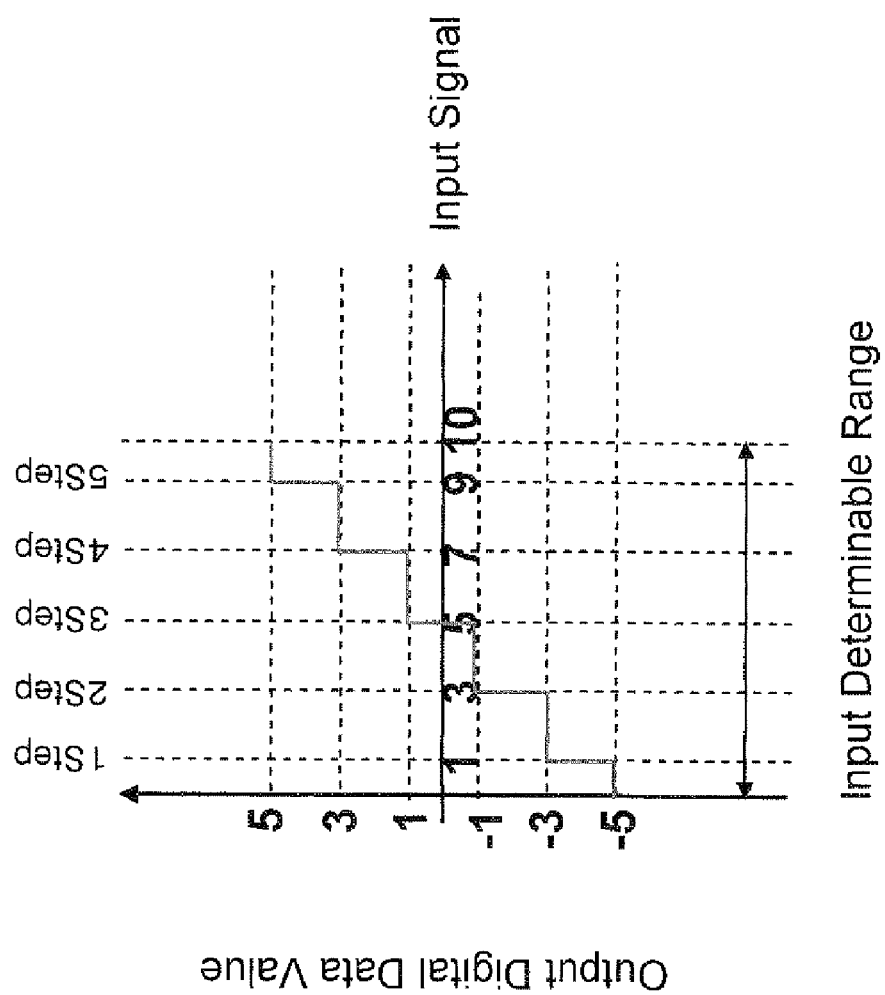
FIG. 2 is a characteristic diagram illustrating an input-output characteristic of a quantizer in the delta sigma A/D modulator according to Embodiment 1 of the present invention.

FIG. 2 is a diagram illustrating the input-output characteristic of the quantizer with the number of steps 5 for outputting an output digital signal (−5 to 5: output step width 2) with respect to an input signal of the input determinable range (0 to 10) where the number of steps n of the quantizer=5 and the input step width VFS_a/n=2.

As will be understood from FIG. 2, the reference signal value of the 3rd step is represented by Vref=5, the inputted signal Vin_C falls within the range of 3<Vin_C<7, the output digital data becomes either −1 or 1, and in this range, the 3rd comparator at the center of the comparator group of 5 steps performs determination.

Now, consideration is given to a case where the quantizer of FIG. 1 is operated for each sampling time as illustrated in Table 1.

When the sampling time is t(n−3), the output signal Vout_f of the integration circuit 1=6, and the output Voffset of the offset addition circuit 3=0, the input signal Vin_C to the quantizer 4 is represented by Vin_C=Vout_f+Voffset=6, and quantizer output data (Vcomp) and ADC output data (Vcomp-Voffset) will both be 1. It should be noted that in this case, the description is made on the assumption that the gain of the variable gain circuit 2 is 1.

When Vout_f=8 for the next sampling time t(n−2), the quantizer output data for the preceding sampling time t(n−3) is represented by the center value Vcomp=1; therefore, the offset output value Voffset=0, the quantizer input signal Vin_C=8, the quantizer output data Vcomp=3, and the ADC output data is also 3.

Furthermore, for the next sampling time t(n−1), since Vcomp=3 for the preceding sampling time t(n−2), the output value of the offset addition circuit 3 shifts by one step width so that Voffset=−2 in agreement with the output data value of ±1. As a result, even if Vout_f=8 is inputted, the signal inputted to the quantizer is offset so that Vin_C=6 and the quantizer output data Vcomp=1. In this case, correction conversion is performed on the ADC output data by the output value of the offset addition circuit so that the ADC output data becomes 3.

Thereafter, similarly, the offset amount for the sampling time t(n) is kept at Voffset=−2 since the quantizer output data Vcomp=1 for the sampling time t(n−1), and the quantizer input Vin_C=10 and the quantizer output data Vcomp=5 for the input signal Vout_f=12. In this case, correction conversion is performed on the ADC output data by the output value of the offset addition circuit so that the ADC output data becomes 7.

Now, as will be understood from Table 1, a component of the integrator output signal, exceeding the input determination range of the quantizer ($0 \leq Vin\_C \leq 10$), is corrected by the offset signal Voffset outputted from the offset addition circuit; therefore, even though the input to the quantizer falls within the input determinable range, correction conversion is performed on the ADC output data by the offset amount Voffset again, thus making it possible to output the digital output data equivalent to the output signal of the integrator circuit, which exceeds the output digital data value of the quantizer.

In FIG. 1, the block, in which the ADC output data is created based on the output data of the quantizer 4 and the output data of the offset control circuit 8 for controlling the offset addition circuit 3, is equivalent to the output processing circuit 7.

TABLE 1

Input/Output Values of Quantizer for Each Sampling

| Sampling Time | Integration Circuit Output Signal Vout_f | Offset Addition Circuit Output Value Voffset | Quantizer Input Signal Vin_C | Quantizer Output Data Vcomp | ADC Output Data Vcomp − Voffset |
|---|---|---|---|---|---|
| t(n − 3) | 6 | 0 | 6 | 1 | 1 |
| t(n − 2) | 8 | 0 | 8 | 3 | 3 |
| t(n − 1) | 8 | −2 | 6 | 1 | 3 |
| t(n) | 12 | −2 | 10 | 5 | 7 |

It should be noted that when the number of steps of comparators is an even number, the control similar to that performed when the number of steps is an odd number can be performed if consideration is given to a comparator position at the center of the comparators using, as the reference, the comparator whose reference voltage is offset to either higher level or lower level.

Further, when the operating power supply voltage is reduced as compared with the normal power supply voltage operation (Eq. 1) and the output amplitude range of the integration circuit output value Vout_f is reduced by 1/a times, it is evident from (Eq. 2) that the gain setting of the variable gain circuit is multiplied a times, thereby performing an operation without making any change to the input signal Vin_C of the quantizer and to the input determination range.

During normal power supply voltage operation $$Vin\_C = Vout\_f + Voffset \quad (Eq. 1)$$

During low power supply voltage operation $$Vin\_C = (Vout\_f/a) \times a(\text{gain setting}) + Voffset \quad (Eq. 2)$$

Hereinafter, the offset addition circuit 3 will be further described. The offset addition circuit 3 includes a plurality of switched capacitor circuits 11N1 to 11Nn and 11P1 to 11Pn, which include: a first switch group for connecting, at a first timing, capacitors to offset reference voltages to charge the capacitors with electric charges; and a second switch group for discharging the electric charges of the capacitors at a second timing. As illustrated in FIG. 10, the switch timing in this case is the timing at which the switch groups are not mutually and simultaneously turned ON.

A plurality of the switched capacitor circuits 11N1 to 11Nn and 11P1 to 11Pn have capacitors Cin21 to Cin2n and switches, and offset reference voltages VNoffset and VPoffset are supplied to the switched capacitor circuits 11N1 to 11Nn and 11P1 to 11Pn, respectively. As the above-mentioned capacitors Cin21 to Cin2n, capacitors having the same capacitance values are basically used, but capacitors having different capacitance values may alternatively be used. In such a case, the determination voltage widths of a plurality of the comparators can be varied from each other, and prevented from having equal distances.

The plurality of switched capacitor circuits 11N1 to 11Nn and the plurality of switched capacitor circuits 11P1 to 11Pn are each connected in parallel. Further, the parallel circuit of the plurality of switched capacitor circuits 11N1 to 11Nn and the parallel circuit of the plurality of switched capacitor circuits 11P1 to 11Pn are serially-connected, and the offset reference voltages VNoffset and VPoffset are applied to both ends of the parallel circuits. Furthermore, the offset signal can be obtained from a connection point between the parallel circuit of the plurality of switched capacitor circuits 11N1 to 11Nn and the parallel circuit of the plurality of switched capacitor circuits 11P1 to 11Pn.

Hereinafter, the description will be made about how the voltage of the offset signal is changed in the offset addition circuit 3 by operations of the plurality of switched capacitor circuits 11N1 to 11Nn and the plurality of switched capacitor circuits 11P1 to 11Pn connected in parallel.

In this case, when a switched capacitor reference voltage is defined as VCM, the offset reference voltage VNoffset is set at a voltage lower than the reference voltage VCM, and the offset reference voltage VPoffset is set at a voltage higher than the reference voltage VCM. Therefore, each of the switched capacitor circuits 11P1 to 11Pn stores an electric charge QP responsive to a voltage difference of VPoffset−VCM, and each of the switched capacitor circuits 11n1 to 11Nn stores an electric charge −QN responsive to a voltage difference of VNoffset−VCM, the polarity of which is opposite to that of the switched capacitor circuits 11P1 to 11Pn.

Hence, in the offset addition circuit 3, the retained electric charge amount can be varied by the number of the switched capacitors connected to an output terminal, and at the maximum, the electric charge amount is variable from the −QN×n-fold negative electric charge to the QP×n-fold positive electric charge.

In other words, if the variable gain circuit 2 is also similarly formed by a switched capacitor, an electric charge, retained by the variable gain circuit when it is outputted, is added to the electric charge from the offset addition circuit, and the resultant electric charge is offset. In this case, the electric charge amount Q generally becomes a value obtained by multiplying a capacitance value C of a capacitor by a voltage V applied to the capacitor; as a result, the voltage inputted to the quantizer is changed in proportion to the electric charge amount that has been offset.

Hereinafter, a control operation performed by the offset control circuit 8 will be described. This offset control circuit 8 performs "m−n" control on the offset addition circuit 3. Specifically, in the "m−n" control, the following control is performed. If the number of comparators is n and the number of steps for output digital data is m steps, the amount of control of the offset addition circuit 3 performed by the offset control circuit 8 will be (m−n). In other words, in the conventional tracking, the switching of m−n reference voltages is carried out, thereby performing the conversion to the number of bits of digital output; however, in this embodiment, the switching of n (<m) offset amounts is carried out, thereby performing the conversion to the number of bits of digital output. The digital output data will have $\log_2(m+1)$ bits.

Hereinafter, the variable gain circuit 2 will be further described. This variable gain circuit 2 includes a switched capacitor circuit. Respective switches of the switched capacitor circuit of this variable gain circuit 2 are each turned ON/OFF at the same timing as that of the associated switch of the switched capacitor circuit of the offset addition circuit 3.

According to Embodiment 1, there is provided the variable gain circuit 2 serving as a gain adjustment circuit for an input of quantizer; thus, even if the power supply voltage is reduced and the amplitude level range of an integrator circuit output is reduced in order to enable a low voltage operation, the maximum amplitude range of a variable gain circuit output can be kept constant without narrowing the range.

Moreover, the quantizer 4 is controlled in the tracking mode and operated by the comparators, the number of which is smaller than that of the comparators when no tracking is performed, thereby narrowing the determinable range in which the quantizer can perform determination for each sampling time, and enabling a reduction in the number of the comparators.

In addition, the determinable range necessary for the quantizer 4 can be narrowed from the maximum input range from the variable gain circuit 2 by the offset amount added from the offset addition circuit 3. Therefore, the offset amount added for each sampling time is adjusted, thereby allowing the determinable range necessary for the quantizer 4 for all sampling times to be always controlled so as to be within the minimum range.

Figure 3:
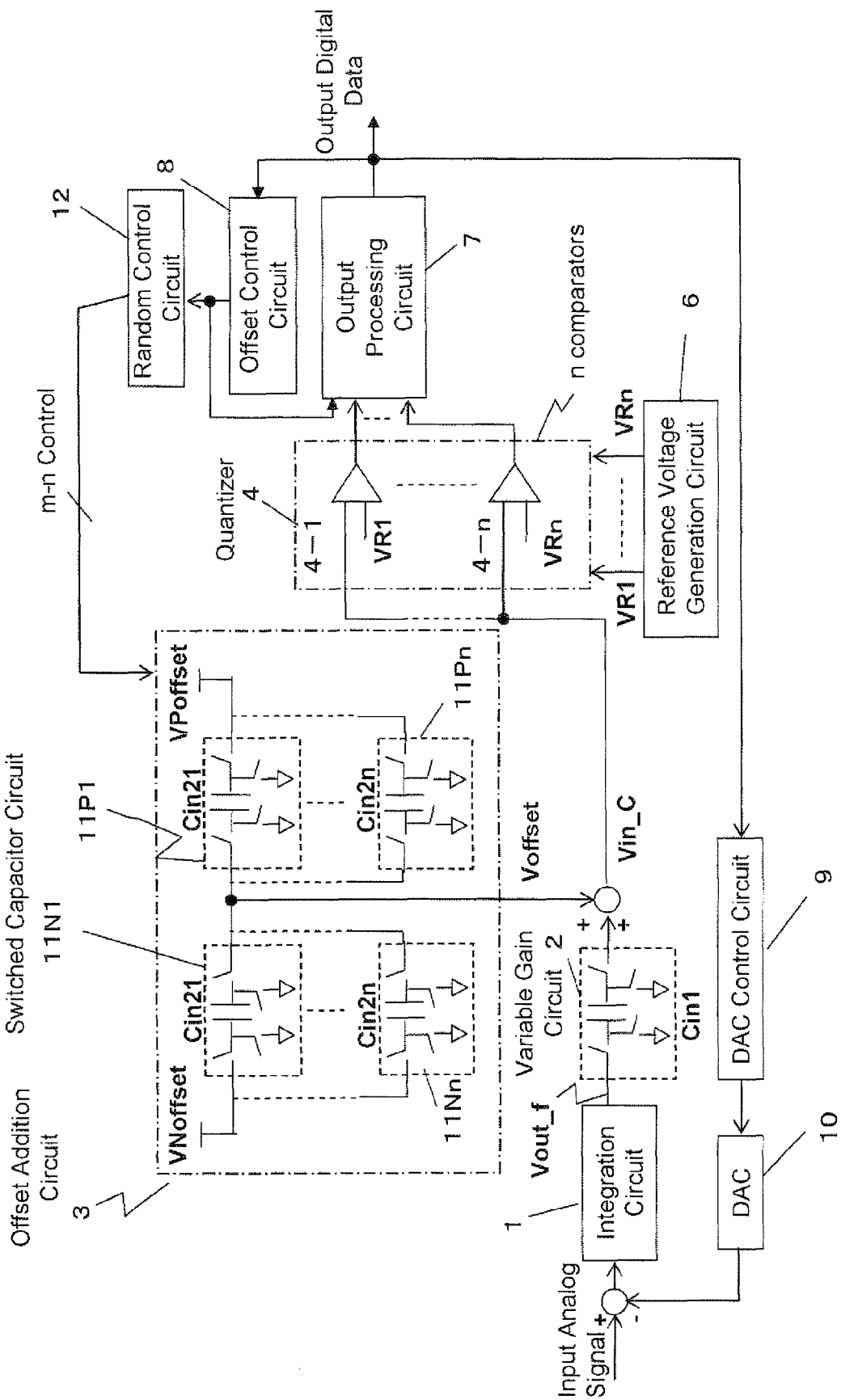
FIG. 3 is a block diagram illustrating Modification 1 of the delta sigma A/D modulator according to Embodiment 1 of the present invention.

In the above-described configuration of FIG. 1, the same switched capacitor circuit is always selected to output the offset signal in response to the control signal supplied from the offset control circuit 8. However, as illustrated in FIG. 3, in order to prevent the same switched capacitor circuit from being always selected to output the offset signal in response to the control signal supplied from the offset control circuit 8, there may be provided a random control circuit 12 for randomly switching an output control destination of the offset control circuit 8 at the second timing so that the random control circuit 12 carries out switching control of an output control signal for controlling the offset addition circuit 3.

In the above-described configuration, when capacitance value variations occur in the capacitors constituting the respective switched capacitor circuits, variations occur in the electric charge amount to be outputted, and therefore, the offset voltage outputted from the offset addition circuit 3 will not be a linear output, resulting in the occurrence of nonlinear strain in the quantizer 4. To cope with this, as illustrated in FIG. 3, the random control circuit 12 for randomizing input/output signal correlation is added at the output of the offset control circuit 8, thereby randomly dispersing the frequency of use of varied capacitances for each sampling time, and enabling a reduction in the occurrence of nonlinear strain resulting from a nonlinear operation by the determination of the quantizer 4.

Furthermore, both of the offset addition circuit 3 and the variable gain circuit 2 may each be formed by a plurality of switched capacitor circuits including switches and capacitors.

In this configuration, the voltage signal Voffset outputted from a switched capacitor group is determined as Voffset=Q/C by the capacitance C of the capacitor included in the switched capacitor group, and the electric charge Q to be charged; therefore, synthesizing of electric charge amounts of the respective outputs is all that is needed to add the offset voltage Voffset of the offset addition circuit 3 to the output signal of the variable gain circuit 2, thus enabling circuit simplification in which outputs of the respective switched capacitors are coupled to provide an output signal.

Furthermore, since the gain value of the variable gain circuit 2 is determined by the ratio between the respective output electric charge amounts added at the offset addition circuit output and the variable gain circuit output, gain adjustment can be carried out just by changing the capacitance of the switched capacitor or the reference voltage.

In normal gain change, it is necessary to adjust input/output gain using an active element such as an operational amplifier; however, compared with this case, the above-described configuration is more effective in carrying out circuit simplification and circuit area reduction.

Figure 4:
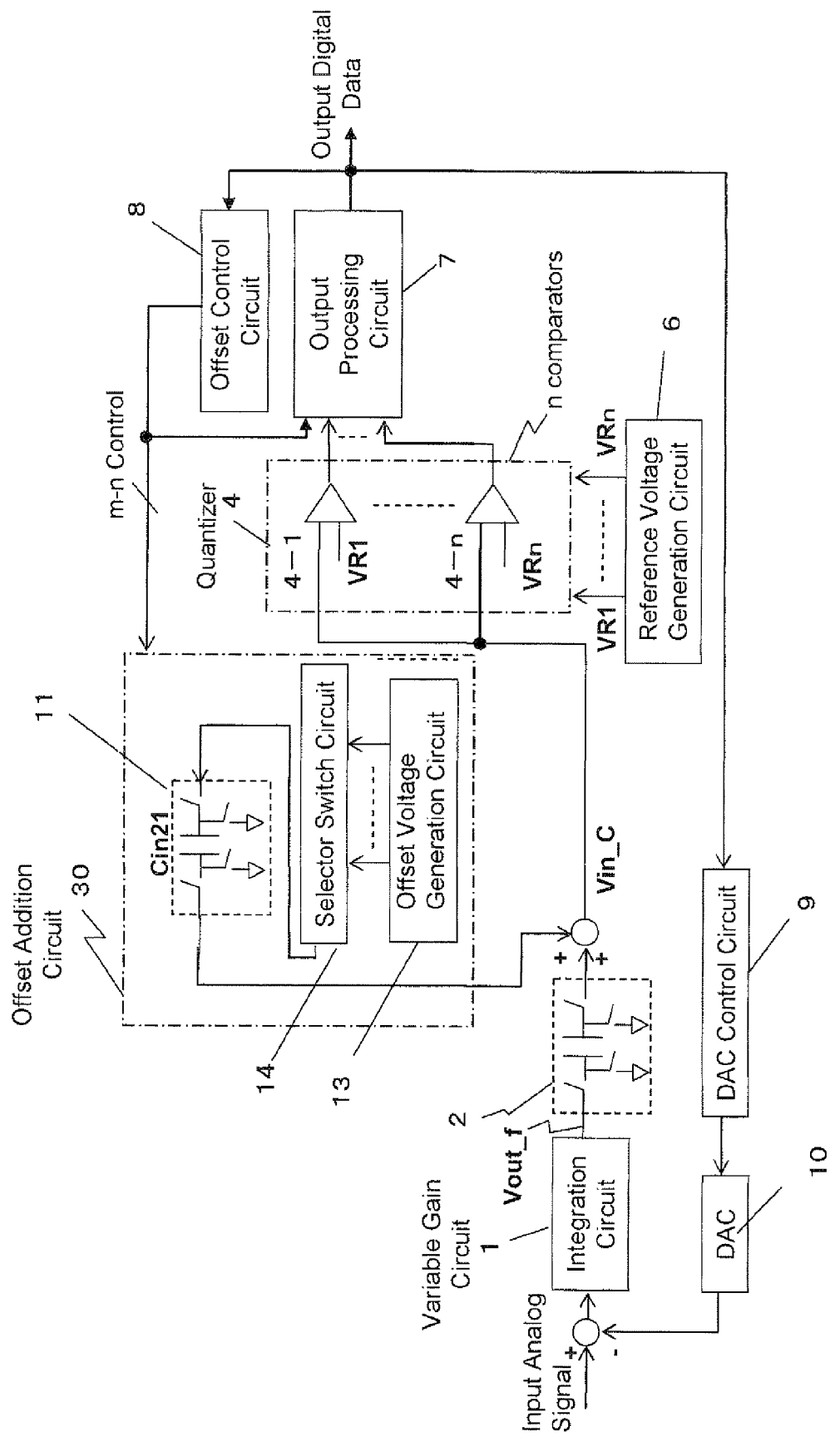
FIG. 4 is a block diagram illustrating Modification 2 of the delta sigma A/D modulator according to Embodiment 1 of the present invention.

Besides, as illustrated in a circuit diagram of FIG. 4, an offset addition circuit 30 may be provided instead of the offset addition circuit 3. The offset addition circuit 30 includes: an offset voltage generation circuit 13 for generating and outputting a plurality of offset voltages; a selector switch circuit 14 for selectively outputting the offset voltage outputted from the offset voltage generation circuit 13; and a switched capacitor circuit 11 for charging/discharging an electric charge equivalent to the offset voltage outputted from the selector switch circuit 14. In this case, the selector switch circuit 14 selects one offset voltage (which is determined by the control signal of the offset control circuit 8) from among the plurality of offset voltages outputted from the offset voltage generation circuit 13, and supplies the selected offset voltage to the switched capacitor circuit 11.

In this configuration, the number of types of the offset voltages outputted from the offset addition circuit 30 can be increased in accordance with the number of types of the offset voltages outputted from the offset voltage generation circuit 13, and therefore, the number of switched capacitor circuits can be decreased to carry out circuit area reduction.

Further, the control of the selector switch circuit 14 may be executed by addition of a random control circuit as in the embodiment illustrated in FIG. 3, thereby randomizing variations in the output signal of the offset voltage generation circuit 13 to enable a reduction in nonlinear strain in the quantizer.

Figure 5:
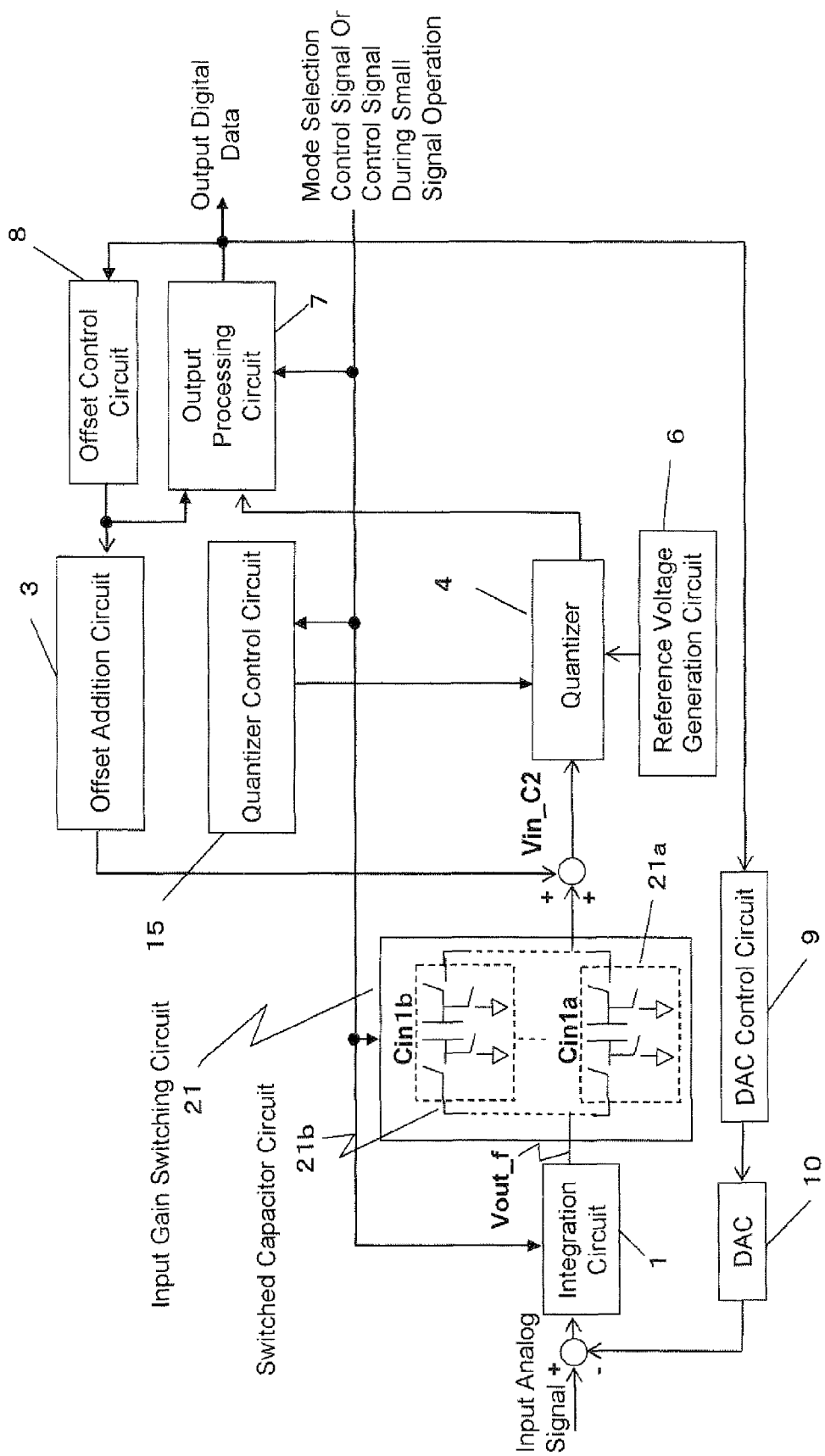
FIG. 5 is a block diagram illustrating Modification 3 of the delta sigma A/D modulator according to Embodiment 1 of the present invention.

Furthermore, as illustrated in FIG. 5, there may be provided a configuration in which the filtering characteristic provided by the integration circuit I is changed by a mode selection control signal, and the number of comparators for performing a determination operation is selected by a quantizer control circuit 15 from among a plurality of the comparators constituting the quantizer 4, thereby switching the determinable input range of the quantizer 4.

In this configuration, when the filtering characteristic of the integration circuit 1 is changed by the mode selection control signal, the amount of change in the input signal to the quantizer 4 for each sampling time is changed, thereby changing the number of comparators necessary for the quantizer 4 at the same time.

Therefore, a comparator, which does not need to be operated, is not operated, and the number of comparators used in each mode is optimized, thereby enabling optimization of current consumption for each operational mode.

Further, an input gain switching circuit 21, illustrated in a configuration example of FIG. 5, may include a plurality of amplifier circuits with different gain settings, and may be formed so that during a small-signal control operation, the gain inputted to the quantizer is switched, and the bit accuracy of the quantizer is changed in accordance with the amplitude level of an input analog signal to the delta sigma A/D modulator. In this case, the bit accuracy represents the number of bits, which is the resolution of output digital data with respect to an input signal.

In FIG. 5, the reference characters 21a and 21b represent switched capacitor circuits constituting the input gain switching circuit 21.

In the above description, the configuration in which the bit accuracy of the quantizer is changed in accordance with the amplitude level of an input analog signal to the delta sigma A/D modulator means that the bit accuracy of the quantizer is increased by raising gain when the level of the input analog signal is low, and the bit accuracy of the quantizer is reduced by lowering gain when the level of the input analog signal is high.

Further, referring to FIG. 5, in the input gain switching circuit 21, a plurality of the amplifier circuits having different gain settings are each formed by the switched capacitor circuit, but instead of the switched capacitor circuit, an active circuit such as an operational amplifier may be used.

In this configuration, an operation can be performed in the maximum determination range of the multibit quantizer even during small-signal control, and therefore, the bit accuracy during small-signal control can be further increased.

Embodiment 2

Figure 6:
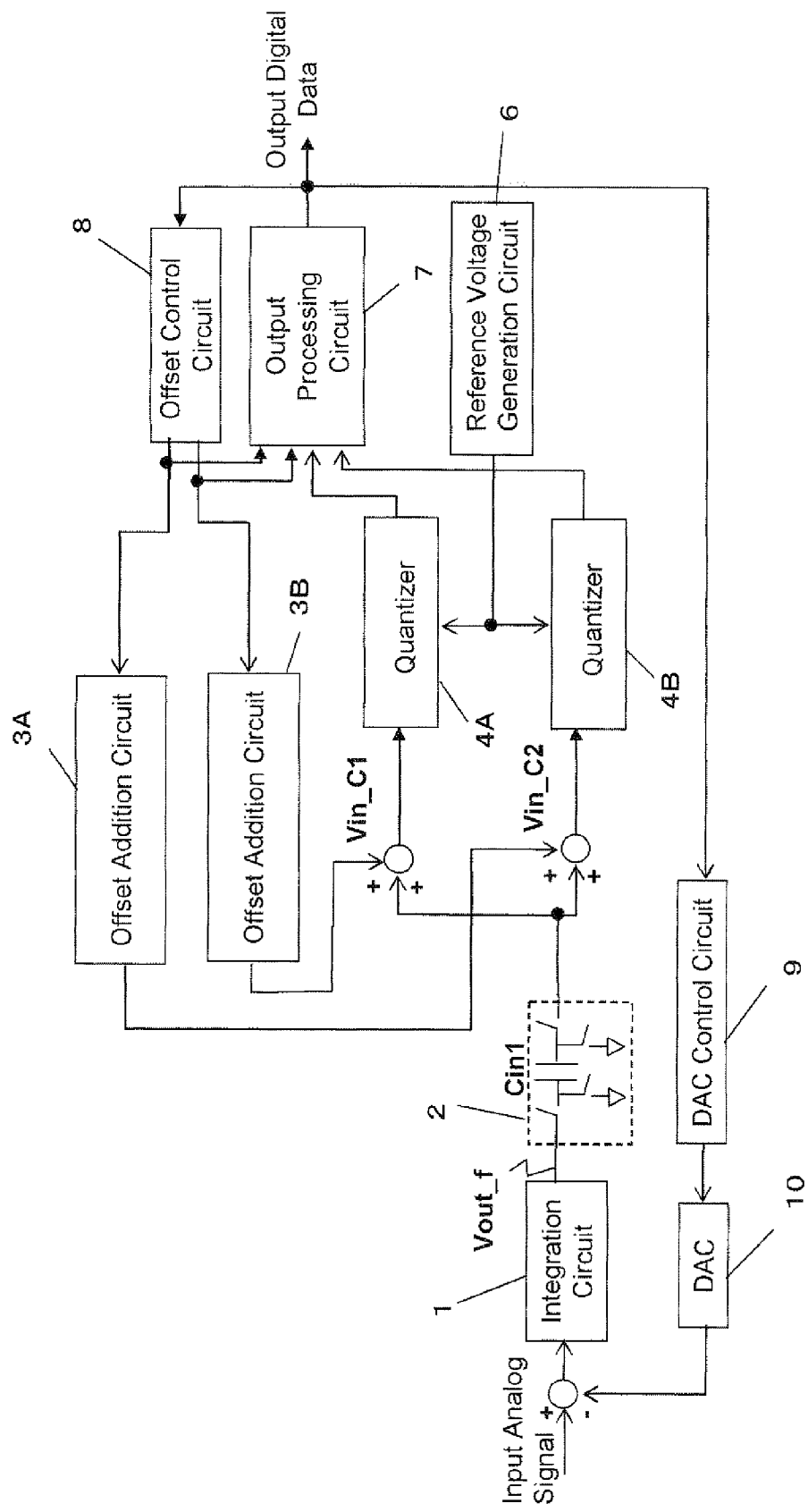
FIG. 6 is a block diagram illustrating a configuration of a delta sigma A/D modulator according to Embodiment 2 of the present invention.

FIG. 6 is a circuit diagram illustrating a tracking mode delta sigma A/D modulator according to Embodiment 2, having a multibit quantizer including a plurality of comparators.

In FIG. 6, the elements similar to those in Embodiment 1 of FIG. 1 are identified with the same reference characters, and the description thereof will be omitted.

In this delta sigma A/D modulator, a quantizer 4 includes: a first quantizer 4A including two or more comparators having a determinable input range in a direction in which an input signal after one sampling time is increased; and a second quantizer 4B including two or more comparators having a determinable input range in a direction in which an input signal after one sampling time is decreased. Further, in order that the respective quantizers 4A and 4B can operate within the respective input determination ranges without causing saturation for input signals, an offset addition circuit 3 includes a first offset addition circuit 3A and a second offset addition circuit 3B so that different offset signals can be added to the first quantizer 4A and the second quantizer 4B.

Furthermore, an output processing circuit 7 is formed by an output processing circuit for generating output digital data based on: digital data outputted from the first quantizer 4A and the second quantizer 4B; and respective control signals for controlling the first offset addition circuit 3A and the second offset addition circuit 3B. Although the output processing circuit 7 according to Embodiment 2 differs in configuration from the output processing circuit 7 according to Embodiment 1 due to the separation of each of the offset addition circuit and the quantizer into two parts, but basically performs processing operations similar to those performed in Embodiment 1.

Operations performed in this configuration will be described with reference to FIGS. 7A and 7B. In FIG. 7A, the number of comparators of the quantizer 4 according to Embodiment 1 is five, for example.

Referring to FIG. 7A, when the number of comparators required in Embodiment 1 is five, with reference to the third comparator (comp3), there are two comparators in each of the direction in which the voltage is increased for each sampling time, and the direction in which the voltage is decreased for each sampling time, and even if a voltage change for ±2 steps occurs for each sampling time, it is possible to perform determination without exceeding the input determination range of the quantizer 4.

On the other hand, in order to perform the similar determination by the quantizer according to Embodiment 2, the quantizer 4A, having a determination range for two steps in the direction in which the voltage is increased from the determination range of the reference comparator, and the quantizer 4B, having a determination range for two steps in the direction in which the voltage is decreased from the determination range of the reference comparator, are operated simultaneously, thereby making it possible to maintain the input determination range equivalent to that of the quantizer 4 according to Embodiment 1 including the five comparators. In FIG. 7A, the quantizer 4A performs input determination in an input determination range A, and the quantizer 4B performs input determination in an input determination range B.

In other words, the determination range of the quantizer is separated into two ranges in the direction in which the amount of change is increased, and in the direction in which the amount of change is decreased, thereby enabling a further reduction in the number of comparators required for each of the quantizers 4A and 4B as compared with the case where the single quantizer is used.

That is to say, the number of steps for each of the quantizers 4A and 4B can be reduced as compared with the number of steps for the quantizer 4 according to Embodiment 1, and the determinable range required for each quantizer can be reduced (i.e., Determination Range of Quantizer 4>Determination Range of Quantizer 4A or 4B).

Therefore, the determination range of each comparator is normally proportional to an operating power supply voltage, and is inversely proportional to the number of comparators constituting a quantizer. Hence, when the determination range of each quantizer is increased to the range in which it is operable at the power supply voltage as illustrated in FIG. 7B, in Embodiment 2, the step width serving as the determination range of each comparator can be further increased compared with Embodiment 1 by reducing the number of comparators of each quantizer.

This is effective in reducing determination errors of the quantizer caused by variations in comparators and reference voltages, thereby improving resolution accuracy.

INDUSTRIAL APPLICABILITY

A delta sigma A/D modulator of the present invention is useful as an A/D converter utilized in wireless field, audio field and the like.

REFERENCE SIGNS LIST

| | |
|---|---|
| 1 | integration circuit |
| 2 | variable gain circuit |
| 3, 3A, 3B | offset addition circuit |
| 4, 4A, 4B | quantizer |
| 5 | comparator |
| 6 | reference voltage generation circuit |
| 7 | output processing circuit |
| 8 | offset control circuit |
| 9 | DAC control circuit |
| 10 | DAC |
| 11, 11N to 11Nn, 11P1 to 11Pn | switched capacitor circuit |
| 12 | random control circuit |
| 13 | offset voltage generation circuit |
| 14 | selector switch circuit |
| 15 | quantizer control circuit |

CITATION LIST

Patent Literature

Patent Literature 1: U.S. Pat. No. 7,221,303 Specification (FIG. 1)

The invention claimed is:

1. A delta sigma A/D modulator comprising:
a DAC circuit;
an integration circuit for adding and integrating an input analog signal and an output signal of the DAC circuit;
a variable gain circuit for changing a gain of an output signal of the integration circuit to provide an output signal;
a quantizer for quantizing the output signal of the variable gain circuit;
an offset addition circuit for generating an offset signal, and for adding the offset signal to the output signal of the variable gain circuit to input the resultant signal to the quantizer, thereby causing the quantizer to output a digital signal equivalent to a level of a total of the output signal of the variable gain circuit and the offset signal;
an offset control circuit for outputting a control signal for controlling the offset addition circuit;
an output processing circuit for generating output digital data equivalent to a value obtained by subtracting the offset signal from the output signal of the variable gain circuit based on the digital signal outputted from the quantizer and the control signal outputted from the offset control circuit; and
a DAC control circuit for receiving, as an input signal, the output digital data outputted from the output processing circuit, and for controlling a level of the output signal of the DAC circuit,
wherein the quantizer comprises two or more comparators for making a comparison between a level of the signal obtained by adding the offset signal to the output signal of the variable gain circuit, and each of reference voltages of a reference voltage group,
wherein the offset control circuit generates a control signal for the present sampling based on the output digital data of the output processing circuit and the control signal for the preceding sampling time, which has been outputted to the offset addition circuit,
wherein the offset addition circuit outputs the offset signal having a voltage responsive to the control signal outputted from the offset control circuit, and
wherein the offset signal of the offset addition circuit is controlled by the offset control circuit for each sampling time so that the quantizer operates without causing a saturation operation with the output signal of the integration circuit falling within a determinable input range of the quantizer, and as a result, the output digital data, in which the number of bits is greater than the number of bits of the quantizer by the offset value controlled by the offset addition circuit, is outputted from the output processing circuit for each sampling time.

2. The delta sigma A/D modulator according to claim 1, wherein the quantizer comprises: a first quantizer comprising two or more first comparators having a determinable input range in a direction in which an input signal after one sampling time is increased; and a second quantizer comprising two or more second comparators having a determinable input range in a direction in which an input signal after one sampling time is decreased,
wherein the offset addition circuit comprises a first offset addition circuit and a second offset addition circuit so that different offset signals can be added to the first quantizer and the second quantizer,
wherein the offset control circuit outputs first and second control signals for controlling the first offset addition circuit and the second offset addition circuit, and
wherein the output processing circuit generates output digital data based on: digital signals outputted from the first quantizer and the second quantizer; and the first and second control signals outputted from the offset control circuit.

3. The delta sigma A/D modulator according to claim 1, wherein the offset addition circuit comprises a plurality of switched capacitor circuits, comprising: a first switch group for applying, at a first timing, an offset reference voltage to a capacitor to charge the capacitor with an electric charge; and a second switch group for discharging the electric charge of the capacitor at a second timing, and
wherein in order to prevent the same switched capacitor circuit from being always selected to output an output signal in response to the signal outputted from the offset control circuit, there is provided a random control circuit for randomly switching, at the second timing, an output control destination of the offset control circuit for the plurality of switched capacitor circuits so that switching control of an output control signal for controlling the offset addition circuit is carried out.

4. The delta sigma A/D modulator according to claim 1, wherein the offset addition circuit and the variable gain circuit are each formed by a plurality of switched capacitor circuits, and a gain of the variable gain circuit is adjusted by a ratio between electric charge amounts outputted to the quantizer and discharged in response to the respective switched capacitor circuits.

5. The delta sigma A/D modulator according to claim 1,
wherein the offset addition circuit comprises: an offset voltage generation circuit for generating and outputting a plurality of offset voltages; a selector switch for selectively outputting one of the offset voltages outputted from the offset voltage generation circuit; and a switched capacitor circuit for charging/discharging an electric charge equivalent to the offset voltage outputted from the selector switch, and the selector switch is controlled by the offset control circuit, thereby controlling the voltage of the offset signal outputted from the offset addition circuit.

6. The delta sigma A/D modulator according to claim 1,
wherein a filtering characteristic provided by the integration circuit is changed by a mode selection control signal, and the number of comparators for performing a determination operation is selected from among a plurality of the comparators constituting the quantizer, thereby switching the determinable input range of the quantizer.

7. The delta sigma A/D modulator according to claim 1,
wherein the variable gain circuit comprises a gain switching circuit formed by a plurality of amplifier circuits with different gain settings, and a gain inputted to the quantizer is switched so that the bit accuracy of the quantizer is increased by raising the gain when an amplitude level of an analog signal is low due to a small-signal control signal, and the bit accuracy of the quantizer is reduced by lowering the gain when an amplitude level of an analog signal is high, thereby changing the bit accuracy of the quantizer in accordance with the amplitude level of the input analog signal.

8. The delta sigma A/D modulator according to claim 2,
wherein the offset addition circuit comprises a plurality of switched capacitor circuits, comprising: a first switch group for applying, at a first timing, an offset reference voltage to a capacitor to charge the capacitor with an electric charge; and a second switch group for discharging the electric charge of the capacitor at a second timing, and wherein in order to prevent the same switched capacitor circuit from being always selected to output an output signal in response to the signal outputted from the offset control circuit, there is provided a random control circuit for randomly switching, at the second timing, an output control destination of the offset control circuit for the plurality of switched capacitor circuits so that switching control of an output control signal for controlling the offset addition circuit is carried out.

9. The delta sigma A/D modulator according to claim 2,
wherein the offset addition circuit and the variable gain circuit are each formed by a plurality of switched capacitor circuits, and a gain of the variable gain circuit is adjusted by a ratio between electric charge amounts outputted to the quantizer and discharged in response to the respective switched capacitor circuits.

10. The delta sigma A/D modulator according to claim 2,
wherein the offset addition circuit comprises: an offset voltage generation circuit for generating and outputting a plurality of offset voltages; a selector switch for selectively outputting one of the offset voltages outputted from the offset voltage generation circuit; and a switched capacitor circuit for charging/discharging an electric charge equivalent to the offset voltage outputted from the selector switch, and the selector switch is controlled by the offset control circuit, thereby controlling the voltage of the offset signal outputted from the offset addition circuit.

11. The delta sigma A/D modulator according to claim 2,
wherein a filtering characteristic provided by the integration circuit is changed by a mode selection control signal, and the number of comparators for performing a determination operation is selected from among a plurality of the comparators constituting the quantizer, thereby switching the determinable input range of the quantizer.

12. The delta sigma A/D modulator according to claim 2,
wherein the variable gain circuit comprises a gain switching circuit formed by a plurality of amplifier circuits with different gain settings, and a gain inputted to the quantizer is switched so that the bit accuracy of the quantizer is increased by raising the gain when an amplitude level of an analog signal is low due to a small-signal control signal, and the bit accuracy of the quantizer is reduced by lowering the gain when an amplitude level of an analog signal is high, thereby changing the bit accuracy of the quantizer in accordance with the amplitude level of the input analog signal.

* * * * *